United States Patent [19]

Claret

[11] 4,286,492
[45] Sep. 1, 1981

[54] CONTROL FOR ELECTRONIC AMPLIFIERS

[76] Inventor: Guy P. Claret, 211 Main St., Townsend, Mass. 01469

[21] Appl. No.: 81,097

[22] Filed: Oct. 2, 1979

[51] Int. Cl.³ .................., G10H 1/02; H03G 3/02
[52] U.S. Cl. ..................... 84/1.27; 84/1.19; 330/128; 330/129; 330/134
[58] Field of Search ............ 84/1.19, 1.24, 1.27; 330/127, 128, 129, 134

[56] References Cited

U.S. PATENT DOCUMENTS

| | | | |
|---|---|---|---|
| Re. 29,490 | 12/1977 | Shamma | 84/1.27 |
| 2,254,284 | 9/1941 | Hanert | 84/1.27 |
| 2,330,109 | 9/1943 | Brown | 330/128 |
| 2,358,325 | 9/1944 | Fyler | 330/128 |
| 2,435,579 | 2/1948 | Francis | 330/128 |
| 2,490,457 | 12/1949 | Nigro | 330/128 |
| 2,511,122 | 6/1950 | Newby | 330/128 |
| 2,513,354 | 7/1950 | Parker | 330/128 |
| 2,516,865 | 8/1950 | Ginzton | 330/128 |
| 2,538,488 | 1/1951 | Volkers | 330/128 |
| 2,592,193 | 4/1952 | Saunders | 330/128 |
| 3,848,092 | 11/1974 | Shamma | 84/1.27 |
| 3,973,461 | 8/1976 | Jahns | 84/1.24 |
| 4,141,269 | 2/1979 | Itakura | 84/1.27 |

*Primary Examiner*—J. V. Truhe
*Assistant Examiner*—Forester W. Isen
*Attorney, Agent, or Firm*—Charles R. Fay

[57] ABSTRACT

A circuit which allows for the simultaneous control of the bias voltages applied to the screen grids and control grids of output tubes while maintaining the ratio of said voltages, thereby providing a method for selectively varying a single plate characteristic (Power Output) of a tetrode/pentode vacuum tube.

In the case of musical instrument amplifiers, it is a desirable effect to drive the power amplifier (output stage) beyond the point that said power amplifier is able to reproduce its input signal accurately, hence causing output distortion. Said point is known as the "Clipping Point".

A clipping point is most usually achieved at high sound pressure levels which are uncomfortable and difficult to work under. By varying said voltages in the previously stated manner, one varies the clipping point accordingly, and therefore is able to obtain output distortion at variable sound pressure levels.

2 Claims, 4 Drawing Figures

CONTROL FOR ELECTRONIC AMPLIFIERS

BACKGROUND OF THE INVENTION

This invention is directed to electronic power amplifiers and is particularly adapted to the field of musical instruments, e.g. electric guitar amplifiers. The electronic power amplifier is a device designed to amplify small signal voltages up to a point where these voltages can be reconverted into usable amounts of power and thus can be used to perform work. In the case of sound or audio applications the electrical power output of the amplifier is used to move the cone of the speaker to produce sound. In the case of radio frequency amplifiers the power output is spread to an antenna and radiates its power signal over long distances.

It is known in the art that the level of distortion as a function of maximum power outlet is more desirable than undistorted power output because when an amplifier is driven into output distortion, (past what is commonly called the "clipping point") desirable musical effects are produced. Among these effects is that the original sound of an electric guitar is totally changed due to the added harmonics caused by the output power distortion of the guitar amplifier, but up to the present time there has been, as far as applicant is aware, no means for controlling the clipping point of the amplifier. By providing a control as described hereinafter, the intensity of the distorted output power can be varied to accommodate the ever changing volume requirement of different acoustical environments, e.g. with relation to small rooms, large halls, etc.

SUMMARY OF THE INVENTION

Providing desirable distortion from an amplifier through variable control of the "clipping point" of the power output stage of the amplifier.

PREFERRED EMBODIMENT OF THE INVENTION

Volume controls may be defined as means for controlling the amplitude of a given signal into its load in the case of audio amplifiers. Controlling volume affects the loudness of a given signal from an amplifier speaker system as perceived by the human ear. If the amplifier should generate at a reference 10 watts loudness, as represented on a sine wave for instance, and the amplitude of the singal is increased to e.g., 40 watts, the ear perceives an increase in volume with respect to the 10 watt reference level; but if the signal is reduced below the 10 watt level, the ear perceives as a decrease in loudness with respect to the base reference.

Distortion is a function of the volume. As more and more volume is demanded from the amplifier the amplifier will supply power to meet the volume demand with good fidelity and with original input wave shape, until more volume is demanded than the rated value of the amplifier when the amplifier is driven past the point of its rated value the volume of the amplifier still increases but the amplifier is forced into a different mode of operation.

The amplifier cannot faithfully reproduce at this high volume level at the same quality of signal that is present at the amplifier's input rating. Distortion of the input signal occurs rapidly as volume is increased to an even higher level, and it is this distorted signal that a musician desires for the reasons outlined above.

Figure 1:
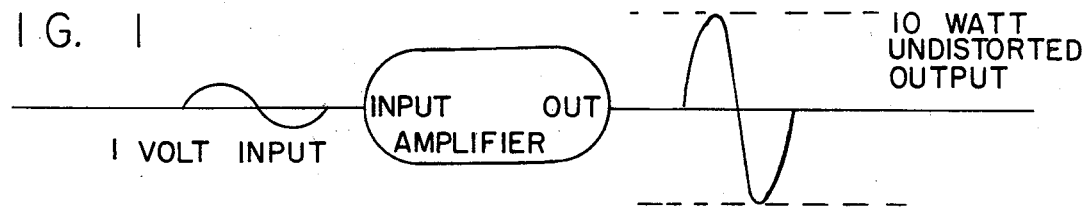
FIG. 1 is an illustration showing the maximum undistorted power for a specific amplifier.
Figure 2:
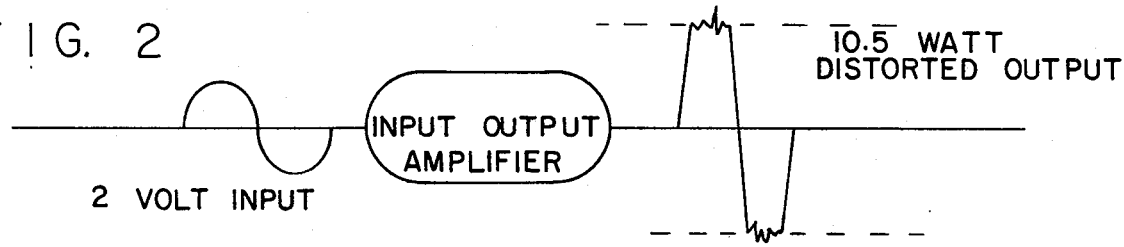
FIG. 2 is a similar view illustrating undistorted and distorted amplifier output power.
Figure 3:
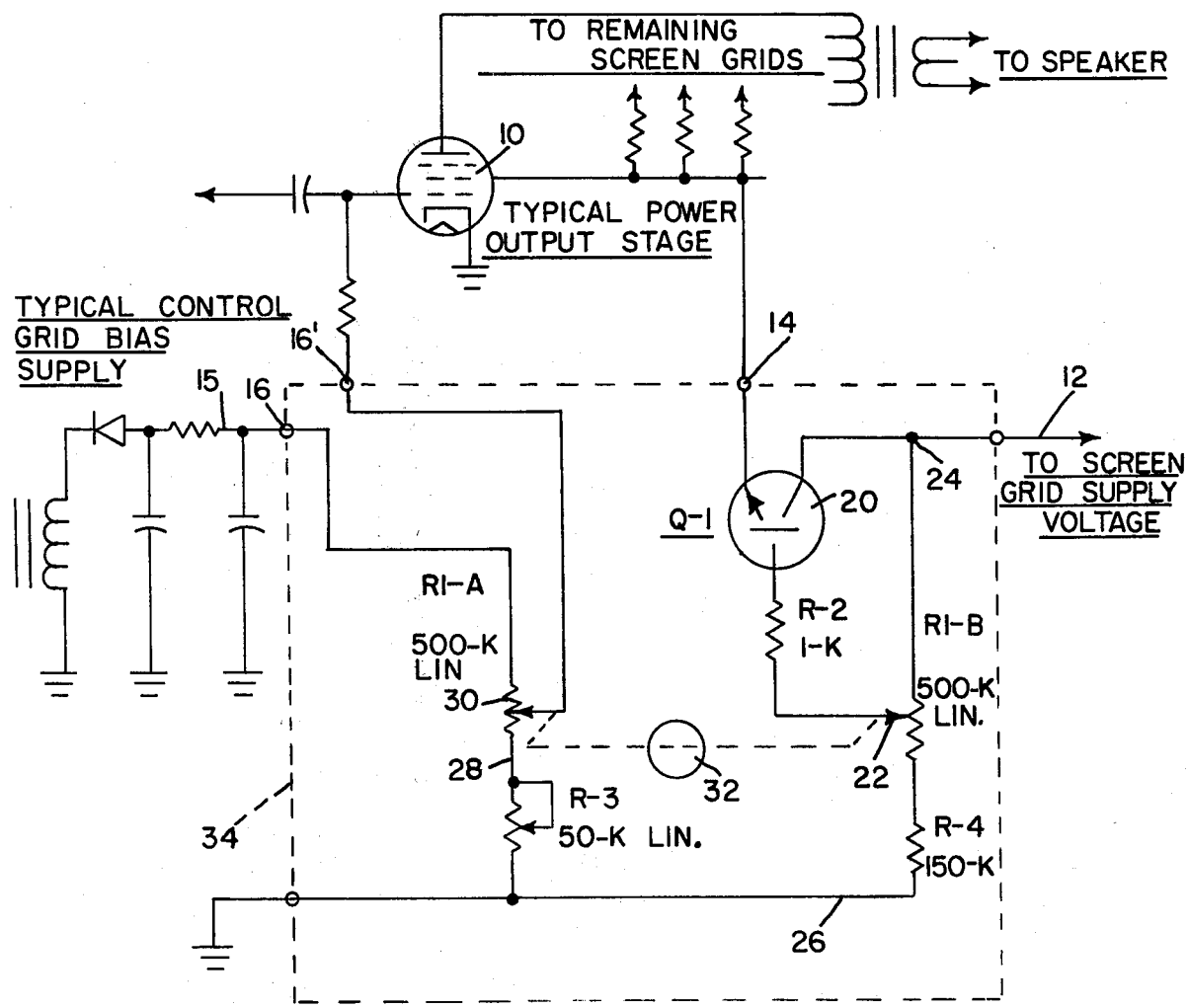
FIG. 3 is a circuit diagram which may be used for this purpose.

As an example of a circuit which may carry out the purposes of the present invention, reference is made to FIG. 3 where the legends are substantially self-explanatory. The usual circuit includes the conventional vacuum tube 10 which has a screen grid and a control grid as is well-known. Normally, the screen grid supply voltage 12 will be connected to the grid supply at 14 and the control grid bias supply generally indicated at 15 will be connected as at 16, 16' to the control grid.

The present invention, however, uses a transistor 20 connected as shown in the diagram to the screen grid supply voltage and also to the variable control device 22. This control device extends from a point at 24 on the screen grid supply to a ground line 26 connected through a line 28 to another variable control device 30. The control device 22 and 30 are connected by a knob 32 which may be manually moved for limiting power to the screen grid and simultaneously adjusting the bias to the control grid in the conventional tube 10.

The control elements at 22 and 30 are voltage dividers and by moving the knob 32 a variation of the clipping point of the output tube is provided thus attaining the distortion that is wanted by the musician.

The dotted line at 34 is in the form of a box which outlines the addition of the present invention with respect to the conventional amplifying system represented by the rest of the diagram outside of the box 34.

Figure 4:
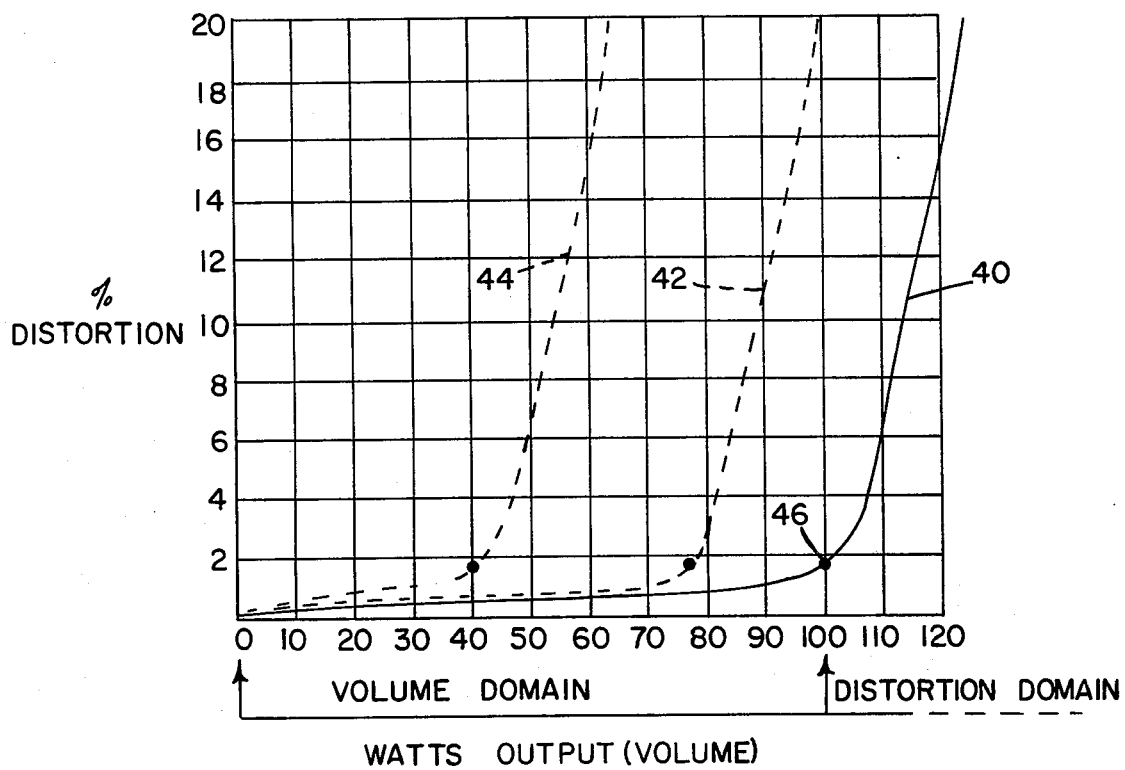
FIG. 4 is a chart.

Referring now to FIG. 4 there is a general explanation here of the basis of the present invention.

The solid line at 40 represents the conventional amplifier divided between the volume domain and the distortion domain and the dotted lines 42 and 44 illustrate the same values showing the effect of adjusting the clipping point of the power amplifier according to the present invention. This illustrates the fact that greater distortion is obtained by the present invention by the use of variable power limiting the output tube and obtaining the distortion desired.

In effect the point 46 (the clipping point) in the chart is shifted deeper into the volume domain and this is what happens when the distortion control is operating. This is accomplished without audibly affecting the volume of the signal that lies within the volume domain. Tests have been made showing interaction to the volume domain to be less than 0.5 db as the distortion control is moved through its range. The original sound quality of the amplifier is not affected until point 46 lies within the volume domain of the input signal. By being able to shift the point deeper into the volume domain of the given power class amplifier a new and richer quality of generative distortion is created, and this is due to the expansion of the distortion domain. At maximum power level of the conventional amplifier the distortion domain is compressed, due to operation of the amplifier beyond the designed limits thereof.

The present invention when set at position for the maximum power settings does not vary the fixed value of the plate voltage of the output tube and this not only helps maintain the original characteristic of signal in the volume domain but is responsible for the expansion of the distortion domain by providing a power "head room" for the distortion product to develop within the reactive load connected to the output tubes, mainly the output transformer and speaker system.

I claim:

1. In a circuit for an electronic amplifier for musical instruments, the amplifier including an output tube having a control grid and a screen grid and including a bias voltage supply for the control grid and voltage supply for the screen grid, improved means to produce and control distortion in the output tube relative to its input by controlling the clipping point of the tube, the improvement comprising the provision of means for controlling the bias voltage level to the control grid, means for controlling the voltage level to the screen grid, and ganged means simultaneously controlling the voltage supply of the screen grid and the bias voltage supply of the control grid so as to change the voltage applied to said screen and control grids together.

2. A circuit for an electronic amplifier incorporating a vacuum tube in the output stage with at least a screen grid and a control grid, and having a control grid bias supply and a screen grid voltage supply, said circuit comprising:

a first voltage divider connected across said control grid bias supply, said voltage divider comprising a first variable resistor having one terminal connected to said control grid bias supply, a variable wiper arm connected to said control grid, and a second variable resistor connected between the other terminal of the first variable resistor and ground, a second voltage divider connected between said screen grid voltage supply and said screen grid, said second voltage divider comprising a third variable resistor having one terminal connected to said screen grid voltage supply, having a variable wiper arm connected to one side of a first fixed resistor, and having a second terminal connected to one side of a second fixed resistor whose other side is connected to ground, the other side of said first fixed resistor being connected to the base of a transistor, said transistor having its collector connected to said screen grid voltage supply and having its emitter connected to said screen grid, and ganged means for moving said variable wiper arms of said first and third variable resistors simultaneously so as to change the voltages applied to said screen grid and control grid together.

* * * * *